(12) United States Patent
Kita

(10) Patent No.: US 11,043,925 B2
(45) Date of Patent: Jun. 22, 2021

(54) HIGH-FREQUENCY MODULE AND COMMUNICATION DEVICE

(71) Applicant: Murata Manufacturing Co., Ltd., Kyoto (JP)

(72) Inventor: Terumichi Kita, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 17/152,108

(22) Filed: Jan. 19, 2021

(65) Prior Publication Data
US 2021/0143780 A1 May 13, 2021

Related U.S. Application Data

(63) Continuation of application No. 16/567,243, filed on Sep. 11, 2019, now Pat. No. 10,924,070, which is a
(Continued)

(30) Foreign Application Priority Data

Mar. 15, 2017 (JP) .............................. JP2017-050494

(51) Int. Cl.
H04B 1/00 (2006.01)
H03H 7/38 (2006.01)
(Continued)

(52) U.S. Cl.
CPC ............... H03F 3/195 (2013.01); H03H 7/38 (2013.01); H03H 7/46 (2013.01); H03H 9/72 (2013.01);
(Continued)

(58) Field of Classification Search
CPC ... H04B 1/40; H04B 1/44; H04B 1/00; H03H 7/38
See application file for complete search history.

(56) References Cited

U.S. PATENT DOCUMENTS 7,848,714 B2 12/2010 Takeda et al.
8,130,787 B2 3/2012 Hagiwara et al.
(Continued)

FOREIGN PATENT DOCUMENTS

JP 2006-295956 A 10/2006
JP 5773082 B2 9/2015
(Continued)

OTHER PUBLICATIONS

International Search Report for International Application No. PCT/JP2018/007822 dated Apr. 10, 2018.
(Continued)

Primary Examiner — Dean O Takaoka
(74) Attorney, Agent, or Firm — Pearne & Gordon LLP

(57) ABSTRACT

A radio frequency module includes a substrate having first and second main surfaces; a first filter; third and fourth switches connected to the filter; an amplifier; and/or a matching circuit element connected to the first filter. In various embodiments, the matching circuit element may be on the first main surface while the amplifier may be on the second main surface; the matching circuit element may be on the first main surface while the third switch may be on the second main surface; and/or the filter may be on the first main surface while the fourth switch may be on the second main surface.

25 Claims, 6 Drawing Sheets

Related U.S. Application Data continuation of application No. PCT/JP2018/007822, filed on Mar. 1, 2018.

(51) Int. Cl.
  *H03F 3/195* (2006.01)
  *H03H 7/46* (2006.01)
  *H03H 9/72* (2006.01)
  *H03F 1/26* (2006.01)

(52) U.S. Cl.
  CPC .............. *H04B 1/006* (2013.01); *H03F 1/26* (2013.01); *H03F 2200/451* (2013.01)

(56) References Cited

U.S. PATENT DOCUMENTS

| | | |
|---|---|---|
| 8,803,632 B2 | 8/2014 | Takeuchi |
| 9,001,710 B2 | 4/2015 | Uejima |
| 2007/0066243 A1 | 3/2007 | Yamauchi et al. |
| 2015/0179621 A1 | 6/2015 | Matsumoto et al. |
| 2018/0190601 A1 | 7/2018 | Hitomi et al. |

FOREIGN PATENT DOCUMENTS

| | | |
|---|---|---|
| WO | 2006/035518 A1 | 4/2006 |
| WO | 2017/033564 A1 | 3/2017 |

OTHER PUBLICATIONS

Written Opinion for International Application No. PCT/JP2018/007822 dated Apr. 10, 2018.

HIGH-FREQUENCY MODULE AND COMMUNICATION DEVICE

CROSS-REFERENCE TO RELATED APPLICATIONS

This is a continuation of U.S. patent application Ser. No. 16/567,243 filed on Sep. 11, 2019, which is a continuation of International Application No. PCT/JP2018/007822 filed on Mar. 1, 2018, which claims priority from Japanese Patent Application No. 2017-050494 filed on Mar. 15, 2017. The contents of these applications are incorporated herein by reference in their entireties.

BACKGROUND OF THE DISCLOSURE

Field of the Disclosure

The present disclosure relates to a high-frequency module and a communication device.

Description of the Related Art

Conventionally, as a high-frequency module mounted on a mobile communication device or the like, for example, a module in which a chip component such as a matching element is mounted on one main surface of a substrate, and a semiconductor chip component including a switch unit configured with a plurality of switches and an amplifying unit configured with a plurality of amplifiers is mounted on the other main surface of the substrate is disclosed (for example, refer to Patent Document 1).

Patent Document 1: Japanese Patent No. 5773082

BRIEF SUMMARY OF THE DISCLOSURE

However, in the above-mentioned Patent Document 1, depending on positions where the switch unit and the amplifying unit are provided in the semiconductor chip component, the isolation characteristics between the switch unit and the amplifying unit may deteriorate. For example, when an output from the switch unit is inputted to the amplifying unit to be amplified, an output from the amplifying unit may return to the output from the switch unit and a signal may be oscillated because the isolation characteristics between the switch unit and the amplifying unit deteriorate.

In order to achieve the above object, a radio frequency module according to an aspect of the present disclosure comprises: a substrate having a first main surface, and a second main surface opposite the first main surface; a fourth switch on the substrate, the fourth switch having a first terminal connected to a first antenna, a second terminal connected to a second antenna, and a third terminal connected to the first terminal or the second terminal; a third switch on the substrate, the third switch having a fourth terminal connected to the third terminal, and a fifth terminal connected to the fourth terminal; a first filter on the substrate, the first filter being connected to the fifth terminal; a first matching circuit element on the substrate, the first matching circuit element being connected to the first filter; and a first amplifier on the substrate, the first amplifier being connected to the matching circuit element, wherein: the first matching circuit element is on the first main surface, and the first amplifier is on the second main surface.

Additionally, the radio frequency module may further comprise a semiconductor chip component, wherein: the semiconductor chip component may comprise the first amplifier, and when the substrate is viewed from a direction perpendicular to the first main surface of the substrate, the semiconductor chip component may at least partially overlaps the first matching circuit element.

Further, when the substrate is viewed from the direction perpendicular to the first main surface of the substrate, the semiconductor chip component may at least partially overlap the first filter.

Further, the semiconductor chip component may further comprise the third switch.

Further, the semiconductor chip component may further comprise a ground electrode, and the ground electrode may be physically arranged between the third switch and the first amplifier in the semiconductor chip component.

Further, the first amplifier may be a low-noise amplifier; and/or the first matching circuit element may be a chip inductor.

Further, the third switch may further have a sixth terminal connected to the third terminal, the radio frequency module may further comprise: a second amplifier on the substrate, a second filter on the substrate, the second filter being connected between the sixth terminal of the third switch and the second amplifier, and a second matching circuit element on the substrate, the second matching circuit element being connected between the second filter and the second amplifier, wherein the second filter and the second matching circuit element may be on the first main surface, and wherein the semiconductor chip component may further comprise the second amplifier; when the substrate is viewed from the direction perpendicular to the first main surface of the substrate, the semiconductor chip component may at least partially overlaps the second matching circuit element; when the substrate is viewed from the direction perpendicular to the first main surface of the substrate, the semiconductor chip component may at least partially overlaps the second filter; the semiconductor chip component may further comprise the third switch; the fourth switch may be on the second main surface of the substrate; the first amplifier and the second amplifier may be low-noise amplifiers; and/or the first matching circuit element and the second matching circuit element may be chip inductors.

Further, the first filter may be on the first main surface, and the fourth switch and the third switch may be on the second main surface; the third switch may further have a sixth terminal connected to the third terminal, wherein the radio frequency module may further comprise: a second amplifier on the substrate, a second filter on the substrate, the second filter being connected between the sixth terminal of the third switch and the second amplifier, and a second matching circuit element on the substrate, the second matching circuit element being connected between the second filter and the second amplifier, wherein the second filter and the second matching circuit element may be on the first main surface, and wherein the second amplifier may be on the second main surface; the first amplifier and the second amplifier may be low-noise amplifiers; and/or the first matching circuit element and the second matching circuit element may be chip inductors.

According to another aspect of the present disclosure, a radio frequency module comprises: a substrate having a first main surface, and a second main surface opposite the first main surface; a fourth switch on the substrate, the fourth switch having a first terminal connected to a first antenna, a second terminal connected to a second antenna, and a third terminal connected to the first terminal or the second terminal; a third switch on the substrate, the third switch having a fourth terminal connected to the third terminal, and a fifth terminal connected to the fourth terminal; a first filter on the substrate, the first filter being connected to the fifth terminal; a first matching circuit element on the substrate, the first matching circuit element connected to the first filter; and a first amplifier on the substrate, the first amplifier being connected to the matching circuit element, wherein: the first matching circuit element is on the first main surface, and the third switch is on the second main surface.

Additionally, the radio frequency module may further comprise a semiconductor chip, wherein: the semiconductor chip may comprise the third switch, and when the substrate is viewed from a direction perpendicular to the first main surface of the substrate, the semiconductor chip component may at least partially overlaps the first matching circuit element.

Further, the semiconductor chip component may further comprise a ground electrode, and the ground electrode may be physically arranged between the third switch and the first amplifier in the semiconductor chip component.

Further, when the substrate is viewed from the direction perpendicular to the first main surface of the substrate, the semiconductor chip component may at least partially overlaps the first filter; the fourth switch may be on the first main surface of the substrate; and/or the first amplifier and the second amplifier may be low-noise amplifiers, and the first matching circuit element and the second matching circuit element may be chip inductors.

A radio frequency module according to another aspect of the present disclosure comprises: a substrate having a first main surface, and a second main surface opposite the first main surface; a fourth switch on the substrate, the fourth switch having a first terminal connected to a first antenna, a second terminal connected to a second antenna, and a third terminal connected to the first terminal or the second terminal; a third switch on the substrate, the third switch having a fourth terminal connected to the third terminal, and a fifth terminal connected to the fourth terminal; and a filter on the substrate, the filter being connected to the fifth terminal, wherein: the filter is on the first main surface, and the fourth switch and the third switch are on the second main surface.

DETAILED DESCRIPTION OF THE DISCLOSURE

Figure 1:
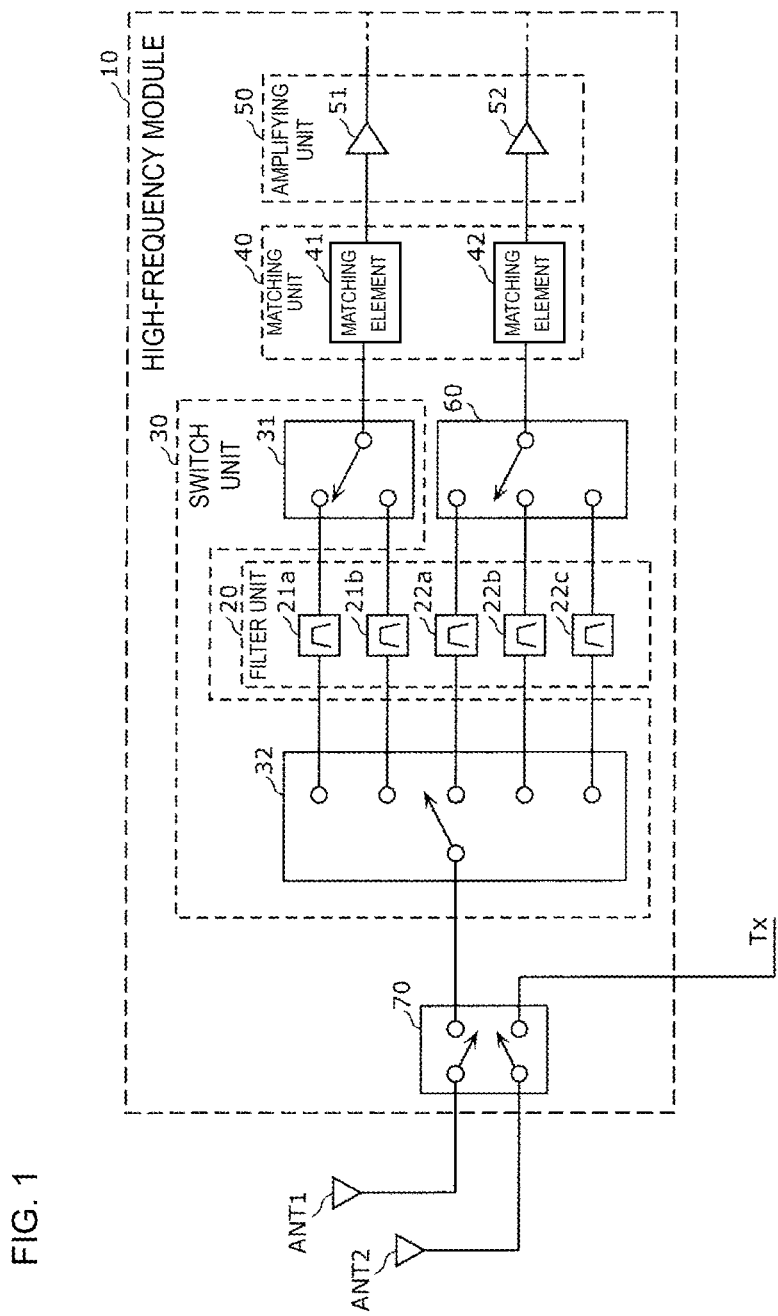
FIG. 1 is a circuit configuration diagram illustrating an example of a high-frequency module according to a first embodiment.

Hereinafter, embodiments of the present disclosure will be described in detail with reference to the examples and the drawings. The embodiments described below are all inclusive or specific examples. The numerical values, shapes, materials, constituent elements, arrangement and connection configurations of the constituent elements shown in the following embodiments are merely examples, and are not intended to limit the present disclosure. Among the constituent elements in the following embodiments, constituent elements that are not described in the independent claims will be described as arbitrary constituent elements. Also, the dimensions of the constituent elements illustrated in the drawings are not necessarily strict. In addition, in the drawings, the same reference signs are used for the same configurations, and a duplicating description thereof will be omitted or simplified.

First Embodiment

[1. Circuit Configuration of High-Frequency Module]

FIG. 1 is a circuit configuration diagram illustrating an example of a high-frequency module 10 according to the first embodiment. In FIG. 1, antenna elements ANT1 and ANT2 are illustrated in addition to the high-frequency module 10. The antenna elements ANT1 and ANT2 are multiband compatible antennas that are compliant with a communication standard, such as long term evolution (LTE), for transmitting or receiving high-frequency signals.

The high-frequency module 10 is, for example, a module disposed in a front end unit included in a multi-mode/multiband compatible cellular phone. The high-frequency module 10 is built in a multiband compatible cellular phone compliant with a communication standard such as LTE.

The high-frequency module 10 includes a filter unit 20 including a plurality of filters, a switch unit 30 connected to the filter unit 20, an amplifying unit 50 configured to amplify a high-frequency signal passing through the filter unit 20, and a matching unit 40 connected between the filter unit 20 and the amplifying unit 50 to perform impedance matching of the amplifying unit 50. Moreover, the high-frequency module 10 includes a fourth switch 70 and a second switch 60. Although the details will be described later, the high-frequency module 10 includes a multilayer substrate 100, and the fourth switch 70, the switch unit 30, the filter unit 20, the second switch 60, the matching unit 40, and the amplifying unit 50 are provided on the multilayer substrate 100 (see FIG. 2, and the like).

The filter unit 20 includes a plurality of filters configured with a surface acoustic wave (SAW) resonator, a bulk acoustic wave (BAW) resonator, a film bulk acoustic resonator (FBAR), or the like. The filter unit 20 includes a plurality of first filters 21a and 21b, and a plurality of second filters 22a to 22c, as the plurality of filters. Each of the first filters 21a and 21b, and the second filters 22a to 22c may be configured with an LC resonance circuit or the like. When the first filters 21a and 21b, and the second filters 22a to 22c are a SAW filter configured with a SAW resonator, each of them is provided with a substrate and an interdigital transducer (IDT) electrode. The substrate is a substrate having piezoelectricity on at least a surface thereof. The substrate may include, for example, a piezoelectric thin film on the surface thereof, and may be configured with a multilayer body formed with a film having a different acoustic velocity from that of the piezoelectric thin film, a support substrate, and the like. The substrate may be, for example, a multilayer body including a high acoustic velocity support substrate and a piezoelectric thin film formed on the high acoustic velocity support substrate, a multilayer body including a high acoustic velocity support substrate, a low acoustic velocity film formed on the high acoustic velocity support substrate, and a piezoelectric thin film formed on the low acoustic velocity film, or a multilayer body including a support substrate, a high acoustic velocity film formed on the support substrate, a low acoustic velocity film formed on the high acoustic velocity film, and a piezoelectric thin film formed on the low acoustic velocity film. Further, the substrate may have piezoelectricity over the entire substrate. Here, it is assumed that the first filters 21a and 21b, and the second filters 22a to 22c are configured with a surface acoustic wave resonator. Accordingly, since each of the first filters 21a and 21b, and the second filters 22a to 22c can be configured with an IDT electrode formed on a substrate having piezoelectricity at least on a surface thereof, it is possible to achieve the small-sized and low-height filter unit 20 having transmission characteristics with a high degree of steepness.

The first filters 21a and 21b are filters having a frequency band included in a first frequency band group as a pass band, and the second filters 22a to 22c are filters having a frequency band included in a second frequency band group different from the first frequency band group as a pass band. The first frequency band group and the second frequency band group are, for example, low band (LB), middle band (MB), high band (HB), and the like. For example, in an explanation focusing on the LB, the frequency band included in the LB is a frequency band such as LTE Bands 8, 12, 13, 26, or the like. For example, in a case where the first frequency band group is the LB, the first filter 21a is a filter whose pass band is any one of Bands 8, 12, 13, 26, or the like, and the first filter 21b is a filter whose pass band is any other one of Bands 8, 12, 13, 26, or the like.

The switch unit 30 is connected to the filter unit 20 and includes a switch configured to switch filters through which a high-frequency signal passes among a plurality of filters. The switch unit 30 includes a first switch 31 and a third switch 32 as the switches described above. The first switch 31 is connected between the filter unit 20 and the matching unit 40 (a first matching element 41 to be described later), and switchably connects one of a plurality of paths passing through the filter unit 20 (paths passing through the first filters 21a and 21b) and one path connected to the matching unit 40. The third switch 32 is connected to one input/output terminal different from the other input/output terminal of the filter unit 20 to which the matching unit 40 is connected. The third switch 32 switchably connects one path connected to the antenna element ANT1, ANT2, or the like via the fourth switch 70 and one of a plurality of paths passing through the filter unit 20 (paths passing through the first filters 21a and 21b, and the second filters 22a to 22c).

The second switch 60 is connected between the filter unit 20 and the matching unit 40 (a second matching element 42 to be described later), and switchably connects a plurality of paths passing through the filter unit 20 (paths passing through the second filters 22a to 22c) and one path connected to the matching unit 40.

The fourth switch 70 is a switch configured to switch between a transmission path and a reception path, and is connected to input/output terminals (for example, input/output terminals 120 illustrated in FIG. 6 to be described later) of the high-frequency module 10. In this embodiment, a path passing through the high-frequency module 10 is used as the reception path. The input/output terminals are connected to, for example, the antenna elements ANT1 and ANT2, the transmission (Tx) path or the like. For example, the antenna element ANT1 is an antenna common for both transmission and reception, and the antenna element ANT2 is an antenna for reception. By the fourth switch 70, the reception path (high-frequency module 10) is connected to the antenna element ANT1 or the antenna element ANT2, or the transmission path is connected to the antenna element ANT1.

The amplifying unit 50 includes a first amplifier 51 for amplifying the high-frequency signal passing through the first filters 21a and 21b, and a second amplifier 52 for amplifying the high-frequency signal passing through the second filters 22a to 22c. That is, the first amplifier 51 amplifies a high-frequency signal in the frequency band included in the first frequency band group, and the second amplifier 52 amplifies a high-frequency signal in the frequency band included in the second frequency band group. In the present embodiment, the first amplifier 51 and the second amplifier 52 are low-noise amplifiers configured to amplify a high-frequency reception signal. Note that the first amplifier 51 and the second amplifier 52 are not limited to low-noise amplifiers, and may be, for example, power amplifiers configured to amplify a high-frequency transmission signal.

The matching unit 40 includes a first matching element 41 connected between the first switch 31 and the first amplifier 51, and a second matching element 42 connected between the second switch 60 and the second amplifier 52. The first matching element 41 performs impedance matching between the first switch 31 and the first amplifier 51, and the second matching element 42 performs impedance matching between the second switch 60 and the second amplifier 52. The first matching element 41 and the second matching element 42 may be, for example, an electronic component such as an inductor, or a capacitor, or may be formed by wiring or the like.

Connection of the first switch 31, the second switch 60, the third switch 32, and the fourth switch 70 is switched by a control unit (not illustrated) or an RF signal processing circuit (RFIC) included in the high-frequency module 10. The first switch 31, the second switch 60, the third switch 32 and the fourth switch 70 are, for example, a field effect transistor (FET) switch made of GaAs or a complementary metal oxide semiconductor (CMOS), or a diode switch.

Note that, in this embodiment, the high-frequency module 10 may not include the second switch 60 and the fourth switch 70. When the high-frequency module 10 does not include the second switch 60, the filter unit 20 may not include the second filters 22a to 22c, the matching unit 40 may not include the second matching element 42, and the amplifying unit 50 may not include the second amplifier 52.

[2. Structure of High-Frequency Module]

Next, a structure of the high-frequency module 10 will be described with reference to FIG. 2.

Figure 2:
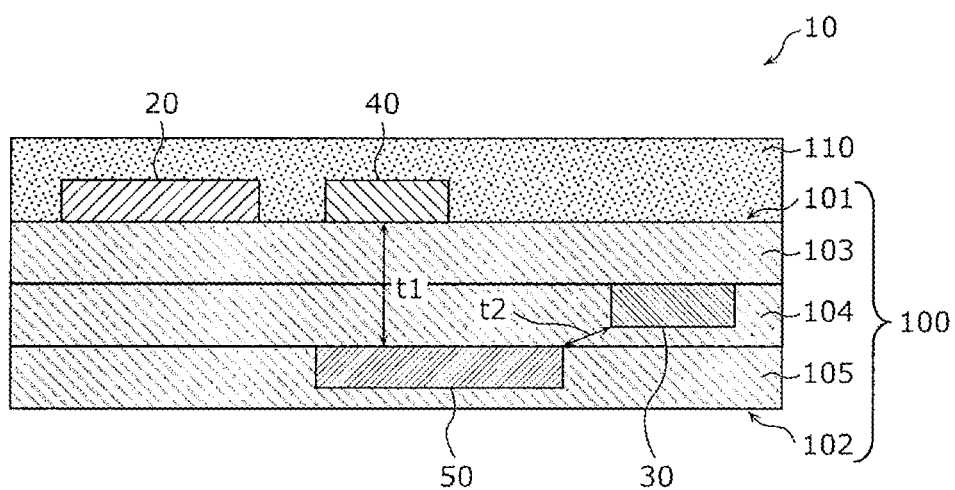
FIG. 2 is a cross-sectional view illustrating an example of the high-frequency module according to the first embodiment.

FIG. 2 is a cross-sectional view illustrating an example of the high-frequency module 10 according to the first embodiment. In FIG. 2, the illustration of the second switch 60 and the fourth switch 70 is omitted.

The high-frequency module 10 is provided with the multilayer substrate 100, and the switch unit 30, the filter unit 20, the matching unit 40, and the amplifying unit 50 are provided on the multilayer substrate 100. The multilayer substrate 100 may be, for example, a printed circuit board or a low temperature co-fired ceramics (LTCC) substrate. The multilayer substrate 100 has one main surface 101 and the other main surface 102, and is configured with inner layers 103 to 105 from a side of the one main surface 101 toward a side of the other main surface 102. That is, a layer on the side of the one main surface 101 of a plurality of layers configuring the multilayer substrate 100 is, for example, the inner layer 103, and a layer on the side of the other main surface 102 is, for example, the inner layer 105. Note that the number of layers configuring the multilayer substrate 100 is not limited to three layers of the inner layers 103 to 105, but may be two layers, or four or more layers.

The matching unit 40 is provided on the one main surface 101 of the multilayer substrate 100. The matching unit 40 may be mounted on the one main surface 101 of the multilayer substrate 100 as an electronic component, or may be formed on the one main surface 101 as wiring. The filter unit 20 is provided, for example, on the one main surface 101. The filter unit 20 and the matching unit 40 provided on the one main surface 101 of the multilayer substrate 100 are resin-sealed with resin 110 (epoxy resin or the like). The filter unit 20 and the matching unit 40 are protected by resin sealing with the resin 110, and reliability of the filter unit 20 and the matching unit 40 can be improved. Although the entire one main surface 101 of the multilayer substrate 100 is covered with the resin 110 in FIG. 2, for example, only the filter unit 20 or the matching unit 40 may be resin-sealed with resin such as underfill resin or the like. Further, a shield electrode may be formed on the resin 110. Thereby, entering of external noise into the high-frequency module 10 can be suppressed, and diffusion of noise emitted from the high-frequency module 10 can be suppressed.

The amplifying unit 50 is provided on the other main surface 102 or in or on the inner layer of the multilayer substrate 100. In the present embodiment, the amplifying unit 50 is provided in or on the inner layer 105. The amplifying unit 50 is configured with, for example, a chip component.

The switch unit 30 is provided on the one main surface 101 or in or on the inner layer different from the other main surface 102 or the inner layer provided with the amplifying unit 50. When the amplifying unit 50 is provided on the other main surface 102, the switch unit 30 is provided in or on any one of the one main surface 101 and the inner layers of the multilayer substrate 100. When the amplifying unit 50 is provided in or on the inner layer, the switch unit 30 is provided in or on a layer different from the one main surface 101, or the layer provided with the amplifying unit 50. In this embodiment, the switch unit 30 is provided in or on the inner layer 104 that is a layer different from the inner layer 105 provided with the amplifying unit 50. The switch unit 30 is configured with, for example, a chip component.

In this manner, in the present embodiment, the switch unit 30 and the amplifying unit 50 are configured with different chip components, and are individually provided on different layers of the multilayer substrate 100.

In addition, in this embodiment, as illustrated in FIG. 2, the amplifying unit 50 and the matching unit 40 are provided on the multilayer substrate 100 such that a distance t1 between the amplifying unit 50 and the matching unit 40 is larger than a distance t2 between the amplifying unit 50 and the switch unit 30. Specifically, the matching unit 40 is provided on the one main surface 101 of the multilayer substrate 100, and the amplifying unit 50 is provided in or on a layer (inner layer 105) closer to the side of the other main surface 102 than the inner layer 104 in or on which the switch unit 30 is provided. The reason for this is that, as illustrated in FIG. 1, the matching unit 40 is connected closer to a side of the amplifying unit 50 than the switch unit 30, so that a feedback amount of a signal from the amplifying unit 50 to the matching unit 40 is larger than that from the switch unit 30.

[3. Effect and the Like]

As described above, in the high-frequency module 10 according to the first embodiment, since the switch unit 30 and the amplifying unit 50 are individually provided on the different layers or the different main surfaces of the multilayer substrate 100, the distance between the switch unit 30 and the amplifying unit 50 is provided to be apart from each other, so that isolation characteristics between the switch unit 30 and the amplifying unit 50 can be improved.

Further, since the matching unit 40 is provided on the one main surface 101 of the multilayer substrate 100 and the amplifying unit 50 is provided in or on the inner layer or the other main surface 102 of the multilayer substrate 100, the distance between the amplifying unit 50 and the matching unit 40 is provided to be apart from each other, so that isolation characteristics between the amplifying unit 50 and the matching unit 40 can be further improved, and thus an output of the amplifying unit 50 can be suppressed from returning to an output of the matching unit 40 and a signal can be suppressed from being oscillated.

Second Embodiment

The second embodiment will be described with reference to FIG. 3. Since a circuit configuration of a high-frequency module 11 according to the second embodiment is the same as that of the high-frequency module 10 according to the first embodiment, a description thereof will be omitted.

Figure 3:
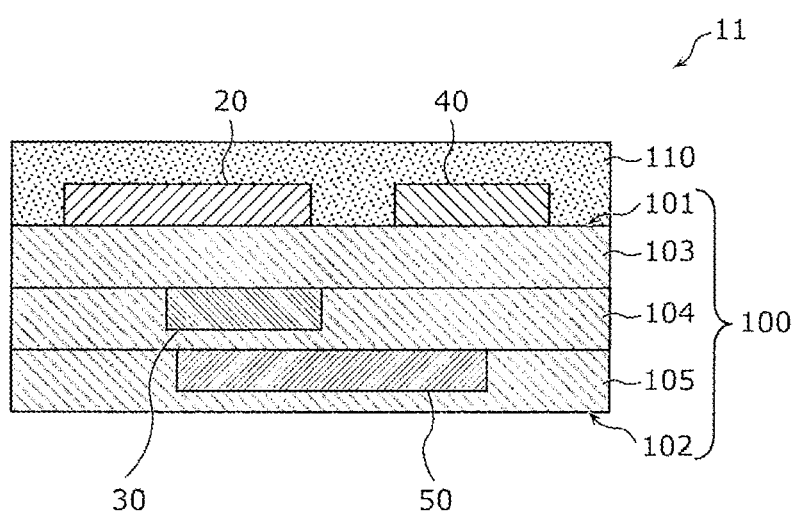
FIG. 3 is a cross-sectional view illustrating an example of a high-frequency module according to a second embodiment.

FIG. 3 is a cross-sectional view illustrating an example of the high-frequency module 11 according to the second embodiment. In FIG. 3, the illustration of the second switch 60 and the fourth switch 70 is omitted. A structure of the high-frequency module 11 according to the second embodiment is different from that of the high-frequency module 10 according to the first embodiment in that at least a part of the switch unit 30 and at least a part of the amplifying unit 50 overlap with each other in a plan view of the multilayer substrate 100. The other points are the same as those of the high-frequency module 10 according to the first embodiment. When a shape of the switch unit 30 in a plan view is larger than that of the amplifying unit 50 in a plan view, the amplifying unit 50 may completely overlap with the switch unit 30 in the plan view of the multilayer substrate 100. When the shape of the switch unit 30 in the plan view is smaller than that of the amplifying unit 50 in the plan view, the switch unit 30 may completely overlap with the amplifying unit 50 in the plan view of the multilayer substrate 100.

According to the configuration of the present embodiment, a shape of the multilayer substrate 100 in a plan view becomes small, so that the high-frequency module 11 can be miniaturized.

Note that it is preferable that a ground layer be provided between the inner layer 104 and the inner layer 105. Consequently, a signal leaking from the amplifying unit 50 is blocked by the ground layer and hardly reaches the switch unit 30, so that the isolation characteristics between the switch unit 30 and the amplifying unit 50 can be improved.

Third Embodiment

The third embodiment will be described with reference to FIG. 4. Since a circuit configuration of a high-frequency module 12 according to the third embodiment is the same as that of the high-frequency module 10 according to the first embodiment, a description thereof will be omitted.

Figure 4:
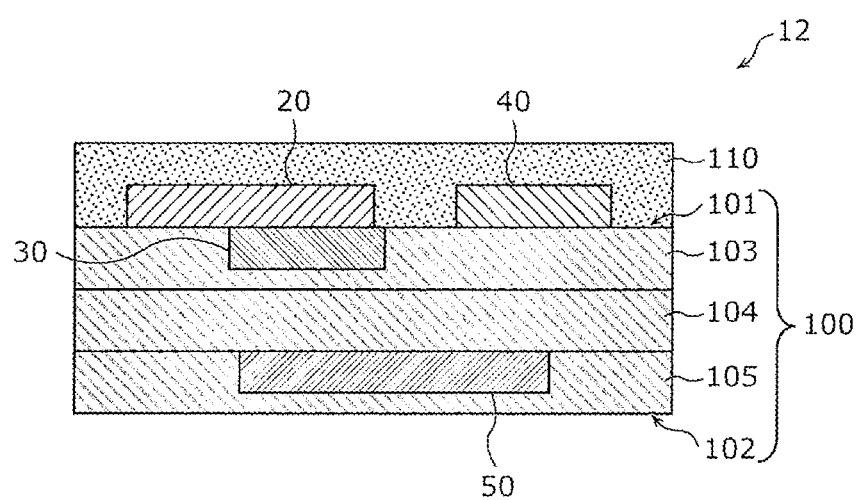
FIG. 4 is a cross-sectional view illustrating an example of a high-frequency module according to a third embodiment.

FIG. 4 is a cross-sectional view illustrating an example of the high-frequency module 12 according to the third embodiment. In FIG. 4, the illustration of the second switch 60 and the fourth switch 70 is omitted. A structure of the high-frequency module 12 according to the third embodiment is different from that of the high-frequency module 11 according to the second embodiment in that the switch unit 30 is provided in or on a layer (for example, the inner layer 103) on the side of the one main surface 101 among the plurality of layers configuring the multilayer substrate 100. The other points are the same as those of the high-frequency module 11 according to the second embodiment. Note that the layer on the side of the one main surface 101 among the plurality of layers configuring the multilayer substrate 100 is a layer that is located closer to the side of the one main surface 101 than a center of the multilayer substrate 100 in a thickness direction.

According to the configuration of the present embodiment, since the switch unit 30 is provided on the side of the one main surface 101 provided with the filter unit 20, a wiring length of each wiring connecting the switch unit 30 (the first switch 31 and the third switch 32) and the filter unit 20 (the first filters 21a and 21b and the second filters 22a to 22c) can be shortened, and transmission loss can be suppressed.

Fourth Embodiment

The fourth embodiment will be described with reference to FIG. 5. Since a circuit configuration of a high-frequency module 13 according to the fourth embodiment is the same as that of the high-frequency module 10 according to the first embodiment, a description thereof will be omitted.

Figure 5:
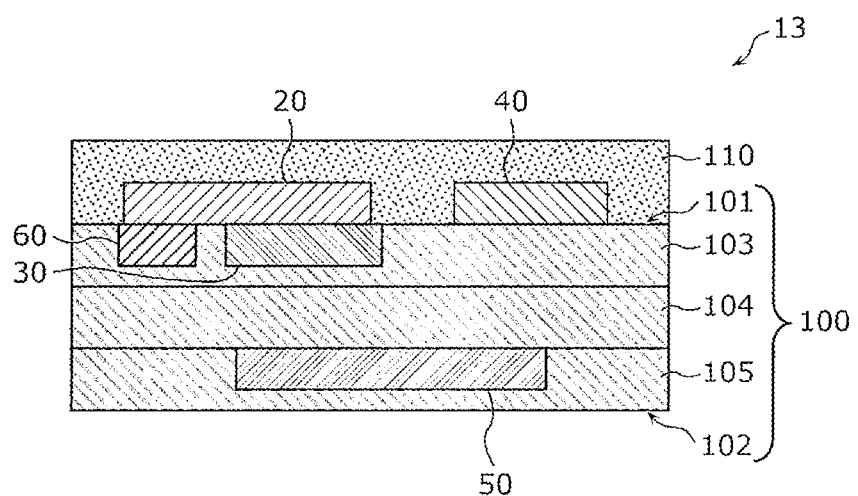
FIG. 5 is a cross-sectional view illustrating an example of a high-frequency module according to a fourth embodiment.

FIG. 5 is a cross-sectional view illustrating an example of the high-frequency module 13 according to the fourth embodiment. In FIG. 5, the illustration of the fourth switch 70 is omitted. A structure of the high-frequency module 13 according to the fourth embodiment is different from that of the high-frequency module 12 according to the third embodiment in that the second switch 60 is provided separately from the switch unit 30 in the multilayer substrate 100. The other points are the same as those of the high-frequency module 12 according to the third embodiment. For example, the second switch 60 is configured with a chip component different from the switch unit 30.

As illustrated in FIG. 1, a high-frequency signal of the frequency band included in the first frequency band group passes through a first path in which the first filters 21a and 21b, the first switch 31, the first matching element 41, and the first amplifier 51 are connected in this order, and a high-frequency signal of the frequency band included in the second frequency band group passes through a second path in which the second filters 22a to 22c, the second switch 60, the second matching element 42, and the second amplifier 52 are connected in this order. At this time, since the first switch 31 (the switch unit 30) and the second switch 60 are provided separately from each other, isolation characteristics between the first path and the second path can be improved.

In this embodiment, the second switch 60 is provided in or on a layer (for example, the inner layer 103) closer to the side of the one main surface 101 among the plurality of layers configuring the multilayer substrate 100. Thus, since the second switch 60 is provided on the side of the one main surface 101 provided with the filter unit 20, a wiring length of each wiring connecting the second switch 60 and the filter unit 20 (the second filters 22a to 22c) can be shortened, and transmission loss can be suppressed.

Fifth Embodiment

The fifth embodiment will be described with reference to FIG. 6. Since a circuit configuration of a high-frequency module 14 according to the fifth embodiment is the same as that of the high-frequency module 10 according to the first embodiment, a description thereof will be omitted.

Figure 6:
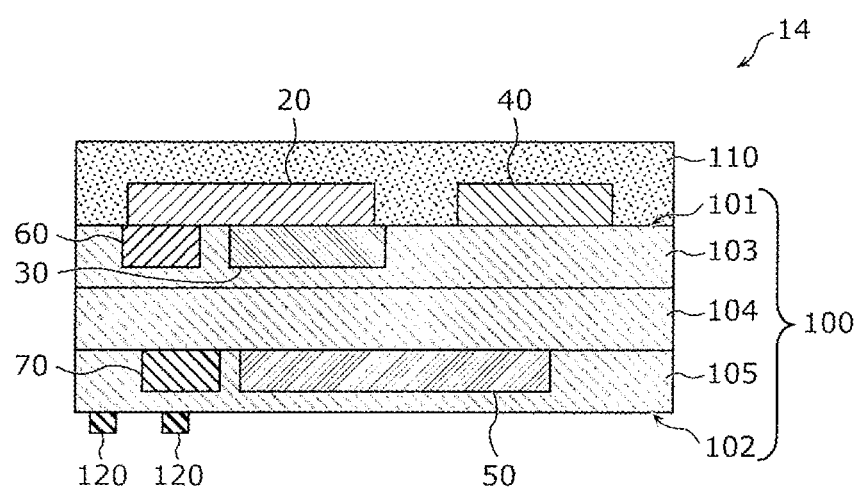
FIG. 6 is a cross-sectional view illustrating an example of a high-frequency module according to a fifth embodiment.

FIG. 6 is a cross-sectional view illustrating an example of the high-frequency module 14 according to the fifth embodiment. A structure of the high-frequency module 14 according to the fifth embodiment is different from that of the high-frequency module 13 according to the fourth embodiment in that the fourth switch 70 is provided separately from the switch unit 30 in the multilayer substrate 100, and input/output terminals 120 (for example, electrodes such as plate or copper paste, or solder) connected to the fourth switch 70 are provided on the other main surface 102. The other points are the same as those of the high-frequency module 13 according to the fourth embodiment. For example, the fourth switch 70 is formed with a chip component different from the switch unit 30. The fourth switch 70 is provided in or on a layer (inner layer 105) closer to the side of the other main surface 102 among the plurality of layers configuring the multilayer substrate 100. Note that the layer closer to the side of the other main surface 102 among the plurality of layers configuring the multilayer substrate 100 is a layer located closer to the side of the other main surface 102 than a center of the multilayer substrate 100 in the thickness direction. Accordingly, since the fourth switch 70 is provided on the side of the other main surface 102 provided with the input/output terminals 120, a wiring length of each wiring connecting the fourth switch 70 and the input/output terminals 120 can be shortened, and transmission loss can be suppressed.

Sixth Embodiment

The sixth embodiment will be described with reference to FIG. 7. Since a circuit configuration of a high-frequency module 15 according to the sixth embodiment is the same as that of the high-frequency module 10 according to the first embodiment, a description thereof will be omitted.

Figure 7:
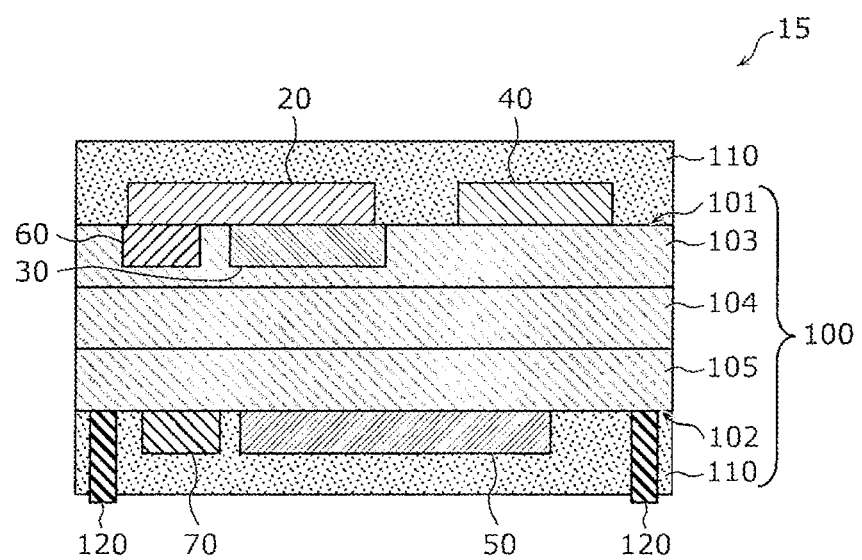
FIG. 7 is a cross-sectional view illustrating an example of a high-frequency module according to a sixth embodiment.

FIG. 7 is a cross-sectional view illustrating an example of the high-frequency module 15 according to the sixth embodiment. A structure of the high-frequency module 15 according to the sixth embodiment is different from that of the high-frequency module 14 according to the fifth embodiment in that the fourth switch 70 and the amplifying unit 50 are provided on the other main surface 102 and are resin-sealed with the resin 110. In the present embodiment, the input/output terminals 120 are, for example, a copper pin, a copper pillar or the like, and are provided on one end side and the other end side of the multilayer substrate 100. The other points are the same as those of the high-frequency module 14 according to the fifth embodiment. The fourth switch 70 and the amplifying unit 50 are protected by the resin sealing with the resin 110, and reliability of the fourth switch 70 and the amplifying unit 50 can be improved. Although the entire other main surface 102 of the multilayer substrate 100 is covered with the resin 110 in FIG. 7, for example, only the fourth switch 70 or the amplifying unit 50 may be resin-sealed with resin such as underfill resin. After the resin sealing process, the resin 110, the input/output terminals 120, the fourth switch 70, and the amplifying unit 50 may be polished. As a result, it is possible to further reduce a height of the high-frequency module 15. Further, a shield electrode may be formed on the resin 110. Thereby, entering of external noise into the high-frequency module 15 can be suppressed, and diffusion of noise emitted from the high-frequency module 15 can be suppressed.

Seventh Embodiment

The seventh embodiment will be described with reference to FIG. 8 to FIG. 9B. Since a circuit configuration of a high-frequency module 16 according to the seventh embodiment is the same as that of the high-frequency module 10 according to the first embodiment, a description thereof will be omitted.

Figure 8:
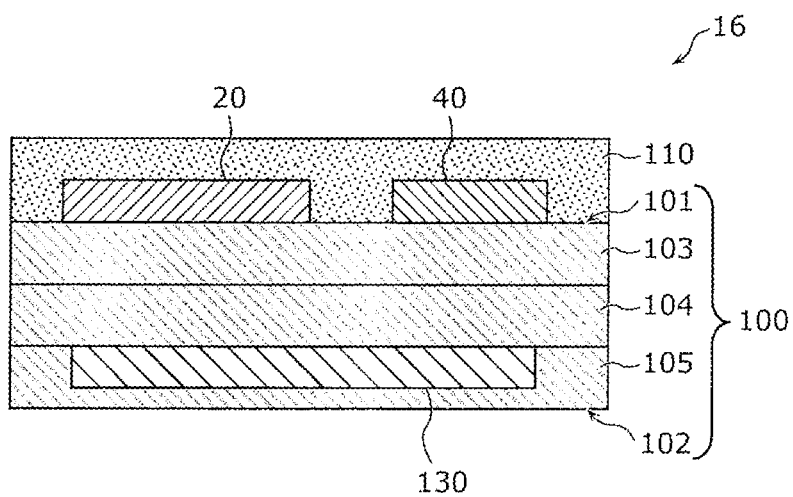
FIG. 8 is a cross-sectional view illustrating an example of a high-frequency module according to a seventh embodiment.

FIG. 8 is a cross-sectional view illustrating an example of the high-frequency module 16 according to the seventh embodiment. A structure of the high-frequency module 16 according to the seventh embodiment is different from that of the high-frequency module 10 according to the first embodiment in that the switch unit 30 and the amplifying unit 50 are formed with one semiconductor chip component 130. The other points are the same as those of the high-frequency module 10 according to the first embodiment. The semiconductor chip component 130 is provided on the other main surface 102 or in or on the inner layer of the multilayer substrate 100. In the present embodiment, the semiconductor chip component 130 is provided in or on the inner layer 105.

Figure 9A:
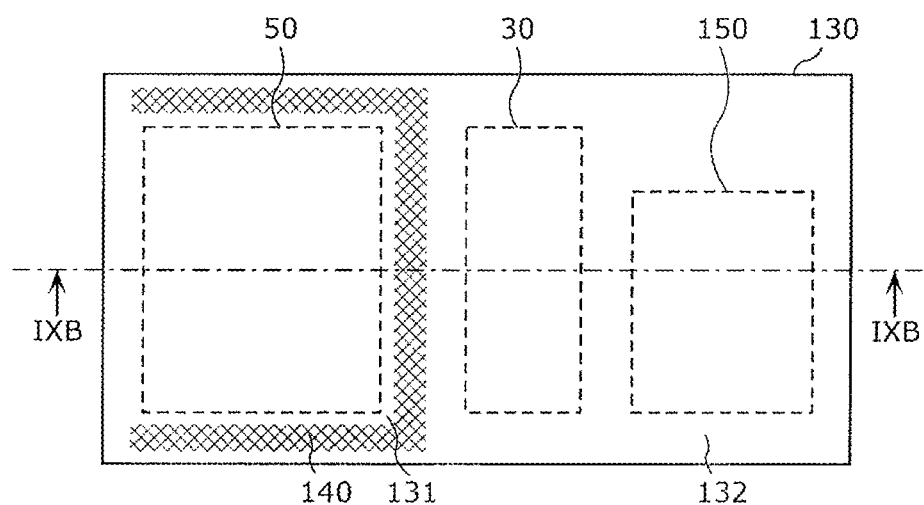
FIG. 9A is a top view illustrating an example of a semiconductor chip component according to the seventh embodiment.

FIG. 9A is a top view illustrating an example of the semiconductor chip component 130 according to the seventh embodiment. FIG. 9B is a cross-sectional view illustrating an example of the semiconductor chip component 130 according to the seventh embodiment. FIG. 9B is a cross-sectional view taken along a line IXB-IXB of the semiconductor chip component 130 in FIG. 9A.

Figure 9B:
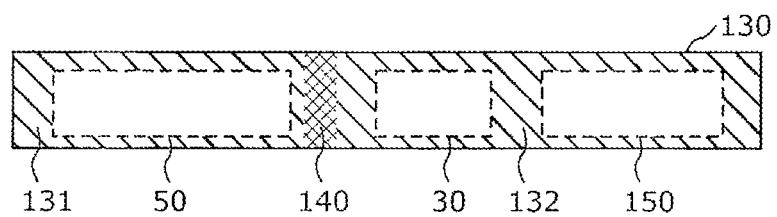
FIG. 9B is a cross-sectional view illustrating an example of the semiconductor chip component according to the seventh embodiment.

As illustrated in FIGS. 9A and 9B, the semiconductor chip component 130 includes a first region 131 and a second region 132 separated by a ground 140, the amplifying unit 50 is provided in the first region 131, and the switch unit 30 is provided in the second region 132. In FIG. 9A and FIG. 9B, a circuit component 150, such as a power supply circuit or a logic circuit, for controlling the switch unit 30 and the amplifying unit 50 is illustrated. The circuit component 150 is provided, for example, in the second region 132 in which the switch unit 30 is provided.

The first region 131 and the second region 132 are separated by the ground 140, a signal leaking from the amplifying unit 50 provided in the first region 131 is blocked by the ground 140, and the signal hardly reaches the switch unit 30 provided in the second region 132, thereby improving isolation characteristics between the switch unit 30 and the amplifying unit 50.

Also, in this embodiment, the amplifying unit 50 and the matching unit 40 are provided on the multilayer substrate 100 such that a distance between the amplifying unit 50 and the matching unit 40 is larger than a distance between the amplifying unit 50 and the switch unit 30. Specifically, the semiconductor chip component 130 and the matching unit 40 are provided on the multilayer substrate 100 such that a distance between the amplifying unit 50 provided on the semiconductor chip component 130 and the matching unit 40 provided on the one main surface 101 becomes larger than a distance between the amplifying unit 50 and the switch unit 30 in the semiconductor chip component 130. Thus, isolation characteristics between the amplifying unit 50 and the matching unit 40 can be further improved, and an output of the amplifying unit 50 can be prevented from returning to an output of the matching unit 40, thereby suppressing oscillation of a signal.

Eighth Embodiment

The eighth embodiment will be described with reference to FIG. 10. The high-frequency module described in the above embodiment can be applied to a communication device.

Figure 10:
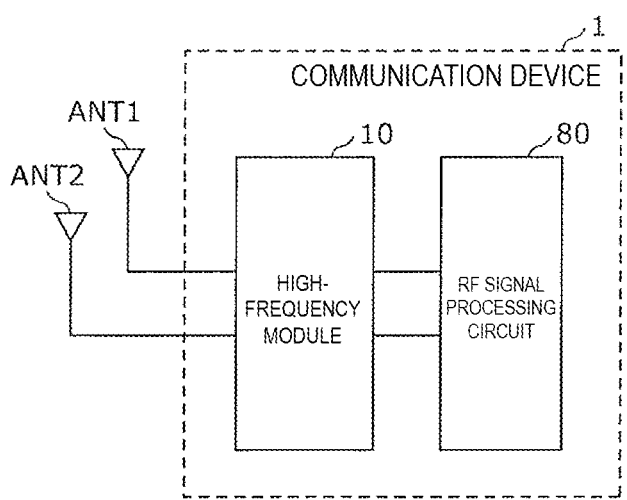
FIG. 10 is a configuration diagram illustrating an example of a communication device according to an eighth embodiment.

FIG. 10 is a configuration diagram illustrating an example of a communication device 1 according to the eighth embodiment. In FIG. 10, the high-frequency module 10, the antenna elements ANT1 and ANT2, and an RF signal processing circuit (RFIC) 80 are illustrated. The high-frequency module 10 and the RFIC 80 configure the communication device 1. Note that the antenna elements ANT1 and ANT2 may be incorporated in the communication device 1.

The high-frequency module 10 is a circuit configured to transmit a high-frequency signal between each of the antenna elements ANT1 and ANT2 and the RFIC 80. The RFIC 80 is an RF signal processing circuit configured to process high-frequency signals to be transmitted or received by the antenna elements ANT1 and ANT2. More specifically, the RFIC 80 performs signal processing on a high-frequency signal inputted from the antenna elements ANT1 and ANT2 via the high-frequency module 10 by down conversion or the like, and outputs the received signal generated by the signal processing to a baseband signal processing circuit (not illustrated).

Since the communication device 1 includes the high-frequency module 10, it is possible to provide a communication device 1 in which isolation characteristics can be improved.

Note that although the communication device 1 includes the high-frequency module 10, the communication device 1 may include any one of the high-frequency modules 11 to 16.

Other Embodiments

Although the high-frequency module and the communication device according to the embodiments of the present disclosure have been described above, the present disclosure is not limited to the embodiments described above. Further embodiments achieved by combining any constituent elements in the above embodiments and modifications obtained by a person skilled in the art without departing from the spirit and scope of the present disclosure are also included in the present disclosure.

For example, in the above embodiment, although the switch unit 30 includes both the first switch 31 and the third switch 32 as a switch connected to the filter unit 20, only one of the first switch 31 and the third switch 32 may be provided. When the switch unit 30 does not include the first switch 31, the matching unit 40 and the amplifying unit 50 may have a matching element and an amplifier for each of the first filters 21a and 21b.

Further, for example, in the embodiment described above, the switch unit 30 is provided in or on the inner layer of the multilayer substrate 100, but may also be provided on the one main surface 101.

Further, for example, in the first and second embodiments, the filter unit 20 may be provided in or on an inner layer of the multilayer substrate 100.

Further, for example, the number of filters configuring the filter unit 20, the number of matching elements configuring the matching unit 40, and the number of amplifiers configuring the amplifying unit 50 illustrated in FIG. 1 are merely examples, and are not limited thereto.

The present disclosure is widely applicable to a communication apparatus such as a cellular phone as a high-frequency module and a communication device that can be applied to a multiband system.

1 COMMUNICATION DEVICE
10 TO 16 HIGH-FREQUENCY MODULE
20 FILTER UNIT
21a, 21b FIRST FILTER
22a TO 22c SECOND FILTER
30 SWITCH UNIT
31 FIRST SWITCH
32 THIRD SWITCH
40 MATCHING UNIT
41 FIRST MATCHING ELEMENT 1
42 SECOND MATCHING ELEMENT 2
50 AMPLIFYING UNIT
51 FIRST AMPLIFIER
52 SECOND AMPLIFIER
60 SECOND SWITCH
70 FOURTH SWITCH
80 RF SIGNAL PROCESSING CIRCUIT (RFIC)
100 MULTILAYER SUBSTRATE
101 ONE MAIN SURFACE
102 THE OTHER MAIN SURFACE
103 TO 105 INNER LAYER
110 RESIN
120 INPUT/OUTPUT TERMINAL
130 SEMICONDUCTOR CHIP COMPONENT
131 FIRST REGION
132 SECOND REGION
140 GROUND
150 CIRCUIT COMPONENT
ANT1, ANT2 ANTENNA ELEMENT

The invention claimed is:

1. A radio frequency module comprising:
a substrate having a first main surface, and a second main surface opposite the first main surface;
a fourth switch on the substrate, the fourth switch having a first terminal connected to a first antenna, a second terminal connected to a second antenna, and a third terminal connected to the first terminal or the second terminal;
a third switch on the substrate, the third switch having a fourth terminal connected to the third terminal, and a fifth terminal connected to the fourth terminal; and
a filter on the substrate, the filter being connected to the fifth terminal, wherein:
the filter is on the first main surface, and
the fourth switch and the third switch are on the second main surface.

2. A radio frequency module comprising:
a substrate having a first main surface, and a second main surface opposite the first main surface;
a fourth switch on the substrate, the fourth switch having a first terminal connected to a first antenna, a second terminal connected to a second antenna, and a third terminal connected to the first terminal or the second terminal;
a third switch on the substrate, the third switch having a fourth terminal connected to the third terminal, and a fifth terminal connected to the fourth terminal;
a first filter on the substrate, the first filter being connected to the fifth terminal;
a first matching circuit element on the substrate, the first matching circuit element being connected to the first filter; and
a first amplifier on the substrate, the first amplifier being connected to the matching circuit element, wherein:
the first matching circuit element is on the first main surface, and
the first amplifier is on the second main surface.

3. The radio frequency module according to claim 2, further comprising:
a semiconductor chip component, wherein:
the semiconductor chip component comprises the first amplifier, and
when the substrate is viewed from a direction perpendicular to the first main surface of the substrate, the semiconductor chip component at least partially overlaps the first matching circuit element.

4. The radio frequency module according to claim 3, wherein when the substrate is viewed from the direction perpendicular to the first main surface of the substrate, the semiconductor chip component at least partially overlaps the first filter.

5. The radio frequency module according to claim 4, wherein the semiconductor chip component further comprises the third switch.

6. The radio frequency module according to claim 5, wherein:
the semiconductor chip component further comprises a ground electrode, and
the ground electrode is physically arranged between the third switch and the first amplifier in the semiconductor chip component.

7. The radio frequency module according to claim 5, wherein the first amplifier is a low-noise amplifier.

8. The radio frequency module according to claim 7, wherein the first matching circuit element is a chip inductor.

9. The radio frequency module according to claim 4, wherein the third switch further has a sixth terminal connected to the third terminal,
wherein the radio frequency module further comprises:
a second amplifier on the substrate;
a second filter on the substrate, the second filter being connected between the sixth terminal of the third switch and the second amplifier; and a second matching circuit element on the substrate, the second matching circuit element being connected between the second filter and the second amplifier, wherein the second filter and the second matching circuit element are on the first main surface, and wherein the semiconductor chip component further comprises the second amplifier.

10. The radio frequency module according to claim 9, wherein when the substrate is viewed from the direction perpendicular to the first main surface of the substrate, the semiconductor chip component at least partially overlaps the second matching circuit element.

11. The radio frequency module according to claim 10, wherein when the substrate is viewed from the direction perpendicular to the first main surface of the substrate, the semiconductor chip component at least partially overlaps the second filter.

12. The radio frequency module according to claim 11, wherein the semiconductor chip component further comprises the third switch.

13. The radio frequency module according to claim 12, wherein the fourth switch is on the second main surface of the substrate.

14. The radio frequency module according to claim 13, wherein the first amplifier and the second amplifier are low-noise amplifiers.

15. The radio frequency module according to claim 14, wherein the first matching circuit element and the second matching circuit element are chip inductors.

16. The radio frequency module according to claim 2, wherein:
the first filter is on the first main surface, and
the fourth switch and the third switch are on the second main surface.

17. The radio frequency module according to claim 16, wherein the third switch further has a sixth terminal connected to the third terminal, wherein the radio frequency module further comprises:
a second amplifier on the substrate;
a second filter on the substrate, the second filter being connected between the sixth terminal of the third switch and the second amplifier; and
a second matching circuit element on the substrate, the second matching circuit element being connected between the second filter and the second amplifier, wherein the second filter and the second matching circuit element are on the first main surface, and wherein the second amplifier is on the second main surface.

18. The radio frequency module according to claim 17, wherein the first amplifier and the second amplifier are low-noise amplifiers.

19. The radio frequency module according to claim 18, wherein the first matching circuit element and the second matching circuit element are chip inductors.

20. A radio frequency module comprising:
a substrate having a first main surface, and a second main surface opposite the first main surface;
a fourth switch on the substrate, the fourth switch having a first terminal connected to a first antenna, a second terminal connected to a second antenna, and a third terminal connected to the first terminal or the second terminal;
a third switch on the substrate, the third switch having a fourth terminal connected to the third terminal, and a fifth terminal connected to the fourth terminal;
a first filter on the substrate, the first filter being connected to the fifth terminal;
a first matching circuit element on the substrate, the first matching circuit element connected to the first filter; and
a first amplifier on the substrate, the first amplifier being connected to the matching circuit element, wherein:
the first matching circuit element is on the first main surface, and
the third switch is on the second main surface.

21. The radio frequency module according to claim 20, further comprising:
a semiconductor chip, wherein:
the semiconductor chip comprises the third switch, and
when the substrate is viewed from a direction perpendicular to the first main surface of the substrate, the semiconductor chip component at least partially overlaps the first matching circuit element.

22. The radio frequency module according to claim 21, wherein:
the semiconductor chip component further comprises a ground electrode, and
the ground electrode is physically arranged between the third switch and the first amplifier in the semiconductor chip component.

23. The radio frequency module according to claim 21, wherein when the substrate is viewed from the direction perpendicular to the first main surface of the substrate, the semiconductor chip component at least partially overlaps the first filter.

24. The radio frequency module according to claim 23, wherein the fourth switch is on the first main surface of the substrate.

25. The radio frequency module according to claim 24, wherein:
the first amplifier and the second amplifier are low-noise amplifiers, and
the first matching circuit element and the second matching circuit element are chip inductors.

* * * * *